United States Patent [19]

Di Mino

[11] Patent Number: 4,705,931
[45] Date of Patent: Nov. 10, 1987

[54] SYSTEM FOR TRIMMING MICROELECTRONIC RESISTORS

[75] Inventor: Alfonso Di Mino, Woodcliff Lake, N.J.

[73] Assignee: ADM Tronics Unlimited, Inc., Northvale, N.J.

[21] Appl. No.: 909,475

[22] Filed: Sep. 19, 1986

[51] Int. Cl.$^4$ ............... H05B 6/00; H01L 21/326; H01L 21/479
[52] U.S. Cl. .................................... 219/68; 437/172
[58] Field of Search .................. 219/68, 69 R, 69 C, 219/69 P; 29/582, 584, 586

[56] References Cited

U.S. PATENT DOCUMENTS

| | | | |
|---|---|---|---|
| 2,737,802 | 4/1941 | Wittke | 29/586 |
| 2,882,463 | 4/1959 | Dickinson | 29/586 |
| 3,119,919 | 1/1964 | Pratt | 219/68 |
| 3,585,338 | 6/1971 | Rosenthal | 219/68 |
| 3,676,633 | 6/1972 | Di Mino | 219/69 C |
| 3,930,304 | 1/1976 | Keller et al. | 219/68 |
| 4,458,129 | 7/1984 | Zasio et al. | 219/68 |

Primary Examiner—A. D. Pellinen
Assistant Examiner—Geoffrey S. Evans
Attorney, Agent, or Firm—Michael Ebert

[57] ABSTRACT

A system for trimming the ohmic value of a resistor included in a microelectronic chip to raise or lower its resistance without changing its physical dimensions. The system is provided with a self-contained unit which generates a low radio-frequency carrier overmodulated by a sonic frequency signal to yield at its output terminal pulsed radio-frequency energy. Coupled by an extension cable to the output terminal of the unit is a portable probe assembly whose position may be manipulated to bring the assembly into operative relation with the resistor to be trimmed. The assembly includes a tank circuit connected by the cable to the output terminal of the unit and tuned to the carrier frequency so that the pulsed energy is stored therein and not radiated. A "Down" probe is inductively coupled in step-up relation to the tank circuit to cause a corona discharge beam to be projected from the tip of this probe, which beam when directed toward a point on the resistor acts to reduce its ohmic value. An "Up" probe is inductively coupled in step-down relation to the tank circuit so that when this probe is brought into contact with a point on the resistor, the resultant current acts to increase its ohmic value.

7 Claims, 6 Drawing Figures

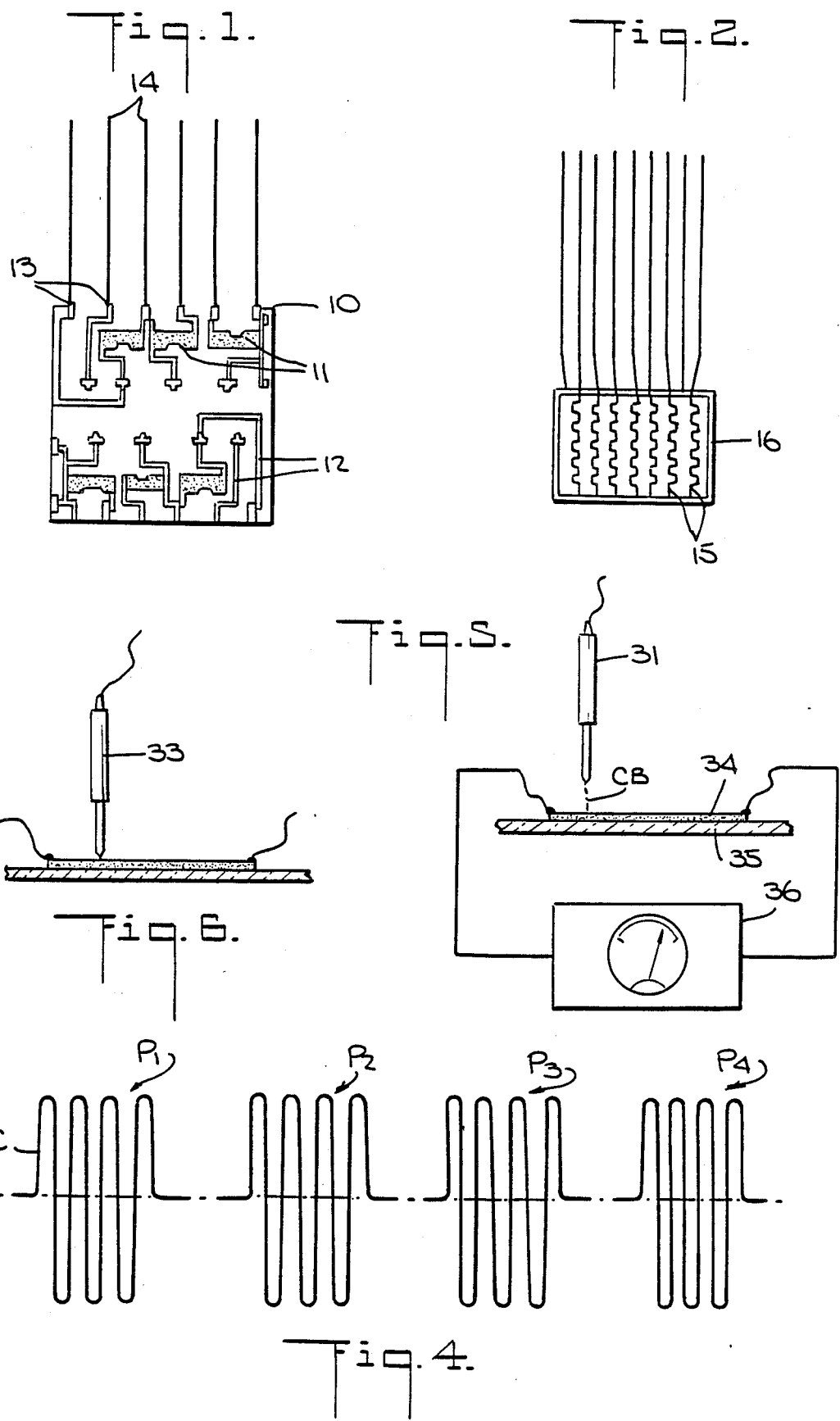

SYSTEM FOR TRIMMING MICROELECTRONIC RESISTORS

BACKGROUND OF INVENTION

1. Field of Invention

This invention relates generally to techniques for trimming the ohmic values of resistors incorporated in microelectronic chips, and more particularly to a system for this purpose adapted to effect an increase or decrease in the value of a resistor without changing its physical dimensions.

2. Status of Prior Art

Microelectronics is that branch of the electronics art which deals with extremely small components, assemblies or systems. In one well-known form of microelectronic structure, resistors, capacitors and conductors are formed by depositing chemical materials onto the surface of a substrate to define a "thin-film" circuit. In another form, a substrate is also employed, but resistors and conductors are printed onto its surface, all other circuit components, such as capacitors, diodes, etc., being discrete elements. This type of microelectronic structure is known as a "thick-film" or a ceramic printed circuit.

Ceramic printed circuits are the main concern of the present invention, for these may be inexpensively mass produced, and, because of their compactness, light weight and low cost, they are widely used in many forms of modern electronic equipment. In the fabrication of ceramic printed circuits, the circuit pattern is printed on a high resolution metal screen. In separate operations, the conductor and resistor materials are pressed through the screen onto a wafer-thin substrate of alumina or other ceramic. The resistive materials are generally in the form of carbon particles dispersed in a binder solution. Use is also made of such resistive materials in particulate form as nichrome, tin oxide, cermet and titanium.

After the conductor and resistor patterns have been printed, the ceramic wafer is placed first in a low-temperature oven which dries the pattern, and then in a high-temperature furnace which fixes the resistor and conductor patterns on the substrate. Next, the conductors are dip-soldered and additional components, such as transistors and capacitors, are soldered, welded or bonded to the substrate. In a final step, the substrate is encapsulated.

While this fabrication technique gives rise to resistance values which are fairly close to the required tolerances, it is still necessary to make a final adjustment, for it is not possible to lay down precision resistors. With existing trimming methods, one percent tolerance is achievable by the physical removal of resistive material embedded in the resistor deposit following the firing cycle. Removal of this material from the edge of the printed resistor by an air-operated abrasion unit gives positive control of precision resistance values.

Nevertheless, the abrasion technique for trimming resistors has many serious drawbacks, for it not only degrades or destroys the physical qualities of the resistors, but it also reduces their physical dimensions, with an accompanying loss in power-handling capacity. Moreover, the abrasion technique is capable only of effecting an increase in resistance value so that if the resistor value, as printed, is initially too high, it is not correctable and the resistor must be rejected.

In projecting a jet of sand or other abrasive material against the resistor surface, it is difficult to control the degree of attrition, as a consequence of which the ohmic value may be caused to rise beyond the desired tolerance. Since correction can only be effected unidirectionally, in the event the trimming action overshoots the desired value, the resistor is no longer correctable and must be rejected. Thus, printed resistors which initially are too high in value or which have been excessively trimmed are beyond correction with existing abrasion trimming techniques.

A single defective resistor in a ceramic printed circuit renders the entire circuit unacceptable, and a mistake in trimming one resistor in a printed circuit assembly makes it necessary to reject the entire circuit. The likelihood of a single error is particularly great when the assembly includes a large number of resistors such as in a ladder network. In practice, therefore, with existing abrasion trimming techniques, the rejection rate is quite high. This factor raises manufacturing costs substantially.

My prior U.S. Pat. Nos. 3,676,633 and 3,647,684 (hereinafter referred to as the Di Mino patents) disclose an electronic technique for trimming the ohmic value of a resistor included in a microelectronic circuit to effect a correction in either direction with respect to the initial value of the resistor without, however, changing its physical dimensions.

Apparatus for this purpose disclosed in these Di Mino patents includes a high-frequency oscillator having a resonator coil to produce an R-F carrier, the oscillator being modulated by an audio-frequency signal to create pulsatory R-F energy. The resonator coil is inductively coupled to a step-up coil connected to a "Down" probe which produces a corona discharge beam that when directed to a point on the resistor acts to reduce its ohmic value. The resonator coil is also inductively coupled to a step-down coil connected to an "Up" probe which when brought into physical contact with a point on the resistor produces a current flow therein that acts to increase the value of the resistor. The extent of such ohmic change is determined by the duration of the treatment and by the area of the resistor subjected to treatment.

Among the advantages of electronic trimming in the manner taught by the Di Mino patents is that no mechanical grinding action is required; hence the ohmic value of the resistor is altered without degrading its physical properties or reducing its power handling capacity. The electronic trimming procedure, because it involves low-power R-F energy, produces no carbon dust or sand; hence its use is in no way hazardous to the health or safety of the operator. And because the electronic trimming technique neither increases nor decreases the physical dimensions of the resistor, it becomes feasible to correct the value of relatively delicate resistors of the type otherwise damaged or destroyed when subjected to abrasion trimming.

Nevertheless, the apparatus disclosed in the Di Mino patents suffers from one practical drawback, and this militates against its commercial use on a production line for trimming resistors.

As pointed out previously, the Up and Down probes are connected to coils inductively coupled to the resonator coil of the oscillator. It is therefore necessary to bring the chip containing the resistor to be trimmed into close proximity with the probes, for it is not possible to bring the probes by way of extension cables to the chip.

The reason for interdicting the use of extension cables is that these cables, since they would be connected to coils inductively coupled to the resonator coil of the oscillator, would then act as radiating antennas. As a consequence, the pulsed radio-frequency energy would be dissipated and not be conveyed to the probes; hence this extension cable arrangement would be ineffective as an electronic trimmer for resistors.

At the time the Di Mino patents were granted, the dimensions of a typical resistor network chip or wafer containing resistors that required trimming was approximately one square inch, and the only way one could trim these resistors was to bring the chip into the close proximity of the probes to perform the required trimming operations. Currently, however, the typical resistor network chip is greatly reduced in size and is in many cases about a tenth of the size of the chips previously produced. One cannot as a practical matter handle these tiny chips to effect trimming by the apparatus disclosed in the Di Mino patents.

Modern production procedures make use of servo mechanisms or X-Y positioning tables to position a device to be worked on relative to a tool or other apparatus to carry out the work. Apparatus of the type disclosed in the Di Mino patents does not lend itself to incorporation in a servo mechanism or an X-Y positioning table, for the apparatus is relatively massive and cannot readily be manipulated.

SUMMARY OF INVENTION

In view of the foregoing, the main object of this invention is to provide a system for trimming the ohmic value of a resistor included in a microelectronic chip to raise or lower its value without changing its physical dimensions, which system makes it possible to manipulate the Up and Down probes so that they can be brought into operative relation to the chip, thereby dispensing with the need to handle the chip to bring it into the proximity of the probes.

A significant advantage of the invention is that it lends itself to use with servo mechanisms or X-Y positioning tables on a production line to carry out resistor trimming operations at a relatively rapid rate.

Also an object of the invention is to provide a system of this type which generates a stable, low radio-frequency carrier overmodulated by a sonic frequency signal to yield pulsed radio-frequency energy at a constant peak amplitude level whereby the system is capable of performing a consistent degree of trimming within a prescribed time period.

Yet another object of this invention is to provide an electronic trimming system adapted to correct the value of a printed circuit resistor to any required accuracy or tolerance, the system making it possible to effect minute ohmic changes not attainable by mechanical abrasion.

Briefly stated, these objects are attained in a system for trimming the ohmic value of a resistor included in a microelectronic chip to raise or lower its resistance without changing its physical dimensions. The system is provided with a self contained unit which generates a low radio-frequency carrier overmodulated by a sonic frequency signal to yield at its output terminal pulsed radio-frequency energy. Coupled by an extension cable to the output terminal of the unit is a portable probe assembly whose position may be manipulated to bring the assembly into operative relation with the resistor to be trimmed. The assembly includes a tank circuit connected by the cable to the output terminal of the unit and tuned to the carrier frequency so that the pulsed energy is stored therein and not radiated. A "Down" probe is inductively coupled in step-up relation to the tank circuit to cause a corona discharge beam to be projected from the tip of this probe, which beam when directed toward a point on the resistor acts to reduce its ohmic value. An "Up" probe is inductively coupled in step-down relation to the tank circuit so that when this probe is brought into contact with a point on the resistor, the resultant current acts to increase its ohmic value.

OUTLINE OF DRAWING

For a better understanding of the invention as well as other objects and further features thereof, reference is made to the following detailed description to be read in conjunction with the accompanying drawing, wherein:

FIG. 1 is a plan view of a typical ceramic printed circuit after being subjected to abrasion trimming;

FIG. 2 is a plan view of another typical ceramic printed circuit which cannot be safely trimmed using standard abrasion trimming techniques;

FIG. 4 illustrates the wave form of the output of the unit included in the system;

FIG. 5 illustrates the manner of using the system to decrease the ohmic value of a printed resistor; and FIG. 6 shows how the value of the same resistor is increased by the system.

DESCRIPTION OF INVENTION

Figure 3:
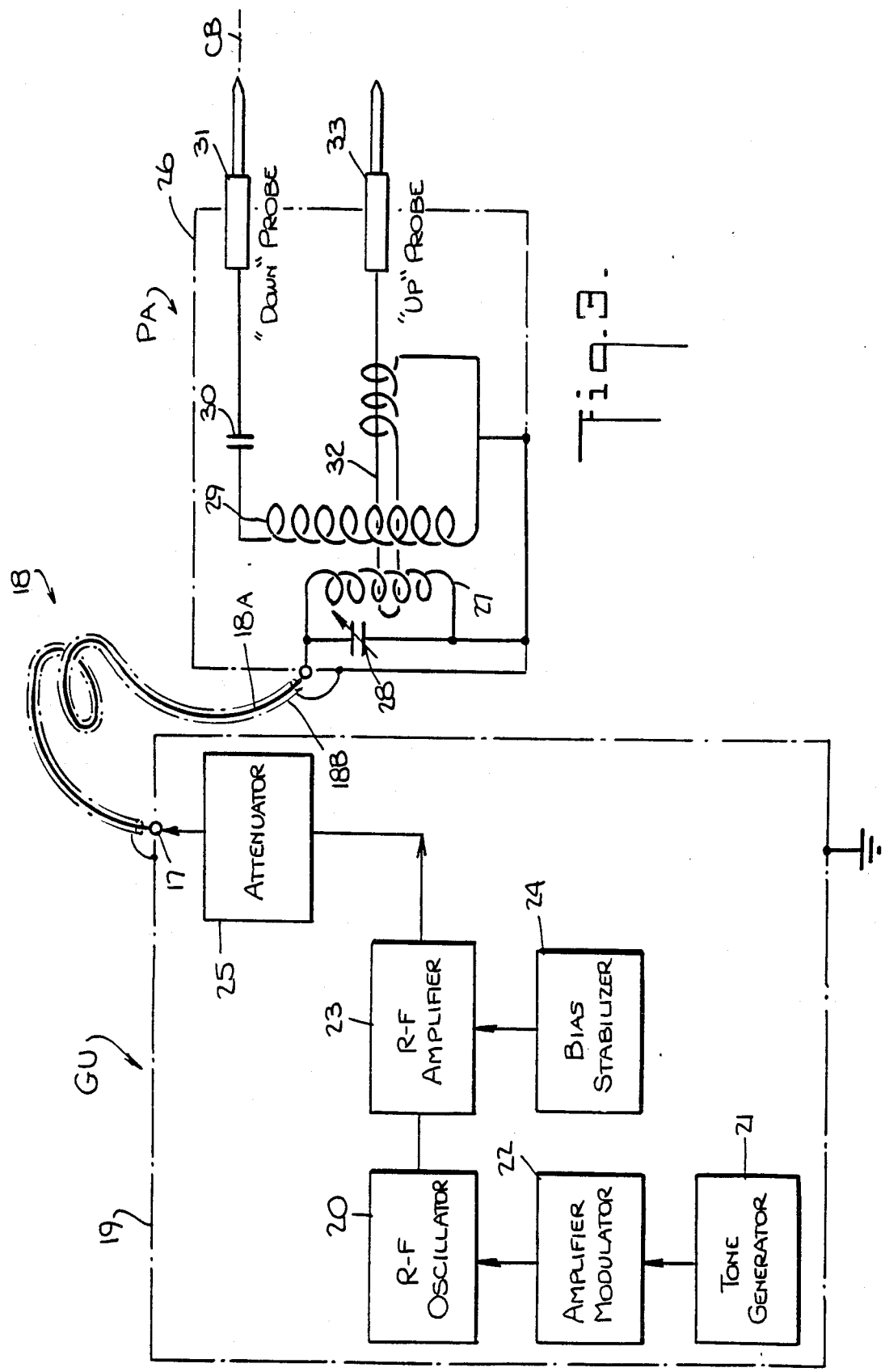
FIG. 3 is a diagram of a modulated high-frequency electronic trimmer system in accordance with the invention.

Referring now to FIG. 1, there is shown a typical microelectronic structure of the thick-film or ceramic printed circuit type. The structure includes a ceramic substrate 10 on which there are printed various resistors 11, connected by printed conductors 12 to terminals 13 having leads 14 soldered thereto.

Resistors 11 are printed so as to assume rectangular forms. However, when the resistors are trimmed by the conventional abrasion technique, material is mechanically removed from the edge of the resistors, so that their physical form and integrity are seriously eroded. The many drawbacks incident to this technique have been previously pointed out, and will not therefore be repeated.

In many instances, in order to provide relatively long resistance paths within a limited area, the resistors are printed in periodic or meandering wave patterns, as shown in FIG. 2, where a bank of parallel resistors 15 are printed on a ceramic substrate 16. Since the resistance path of each of these elements is relatively narrow, should an attempt be made to trim these resistors using the standard abrasion technique, there is a strong likelihood that abrasion will cause a break in the path and thereby open-circuit the resistor. Hence in ladder networks and in other circuits which incorporate a concentrated number of resistors having narrow dimensions, it is extremely difficult to avoid damaging the resistor in the course of abrasion trimming.

The present invention obviates the use of mechanical grinding or attrition and effects trimming by an electronic action which alters the resistive value without a change in physical dimensions.

Referring now to FIG. 3, a system in accordance with the invention is composed of a generating unit GU that produces a low radio-frequency carrier overmodulated by a sonic frequency signal to yield at its output terminal 17 pulsed radio-frequency energy, and a probe assembly PA coupled to this generating unit by a coaxial extension cable 18.

Unit GU, which is housed within a grounded shielding box 19, includes a low radio-frequency generator 20 producing a carrier lying in the frequency range of 200,000 to 300,000 Hz. The generator is frequency-controlled by a piezoelectric crystal oscillator operating at, say, 200 kHz, the carrier generator being stabilized as to amplitude.

The term "low radio-frequency" as used herein refers to that band in the R-F spectrum which lies in the 100,000 to 1,000,000 Hz frequency range normally reserved for long distance radio telegraphy. Any conventional stable, low radio frequency generator may be used in the system.

Also included in unit GU is an audio-frequency or tone generator 21 to produce a sonic signal in the frequency range of about 3000 to 5000 Hz. This sonic signal is amplified in amplifier/modulator 22 and is applied as a modulating signal to R-F generator 20. In practice, the tone generator is preferably a solid state, transistorized oscillator yielding a steady monovalent signal, with tolerances as minimal as present standards will allow. Amplifier/modulator 22 is preferably also a solid state device.

The modulated carrier from R-F generator 20 is applied to an R-F amplifier 23 whose output amplitude is regulated by a bias stabilizer 24 to maintain a constant peak amplitude. The output of R-F amplifier 23 is applied to output terminal 17 through an adjustable attenuator 25. Unit GU is a self-contained unit and also includes the necessary power supplies for the stages thereof, all of which are housed within the shielding box.

In amplitude-modulation, the amplitude of a high-frequency carrier is varied in accordance with the sonic signal, and the resultant modulated wave containing side bands that are the sum and difference of the carrier and signal frequencies. When the modulation index "M" is zero, no signal formation is conveyed to the carrier. Where, however, $M=1$ (100% modulation), then in the case of a sinusoidal carrier wave, the envelope of the carrier varies from zero to twice the value of its unmodulated amplitude. But if "M" exceeds unity, the carrier is then overmodulated, as a consequence of which the carrier is periodically interrupted at a repetition rate in accordance with the audio-frequency signal.

In the present invention, as shown in FIG. 4, the radio-frequency carrier C is overmodulated by the sonic frequency signal, this resulting in periodic bursts $P_1$, $P_2$, $P_3$, etc. of radio-frequency energy whose repetition rate is at the sonic frequency. These bursts of radio frequency energy are yielded at the output terminal 17 of unit GU.

Probe assembly PA is housed in a small insulated tube 26 and is portable. Assembly PA includes a tank circuit formed by a tank coil 27 and a variable capacitor 28 in parallel therewith. One end of coil 27 is coupled by the inner conductor 18A of the coaxial extension cable 18 to the output terminal 17 of generator unit GU. The tubular outer conductor 18B of the cable is connected at one end to shield 19 of generator unit GU which is grounded and at the other end to the ground end of coil 27. Tube 26 therefore serves as a convenient handle for the probe assembly.

A tank circuit of the type disclosed is capable of storing R-F energy over a band of frequencies continuously distributed about the resonant frequency of the circuit which in this instance is tuned to the carrier frequency of R-F oscillator 20 in the generator unit GU. The coaxial cable does not function as a radiating antenna, and all energy produced by the generating unit is stored in tank circuit 27–28.

Inductively coupled to tank coil 27 of the tank circuit is a step-up coil 29, the two coils functioning as a step-up transformer whose step-up ratio depends on the number of turns in coil 29 relative to coil 27. One end of step-up coil 29 is grounded, the other end being connected through a fixed coupling capacitor 30 to a tipped "Down" probe 31, so called because it serves to decrease or bring down the value of a resistor being treated by this probe. Because all of the pulsed R-F energy from the generator unit GU is stepped up and transferred to the tip of "Down" probe 31, a corona beam discharge CB is axially projected from this tip.

As is well known, corona is the phenomenon of air breakdown when the electric stress at the surface of a conductor exceeds a certain value. At higher values, the stress results in a luminous discharge. At a still higher critical voltage value, spark-over occurs. In the present invention, the R-F voltage level is such as to produce a luminous corona discharge.

Step-up coil 29 is shock excited by the bursts $P_1$, $P_2$ etc. of the radio-frequency energy, the resultant damped wave surges having a high peak amplitude. This causes the desired corona discharge to produce a pencil beam which is both visible and audible. The reason it is visible is that the corona beam produces a blue glow, and the reason it is audible is that the bursts of energy are at a sonic rate and can therefore be heard. In practice, the power output of the system may be in the order of 5 to 15 watts, and since it is not radiated, it produces no interference.

Inductively coupled to tank coil 27 and step-up coil 29 is a single turn "blind" coil 32, one end of which is connected to an "Up" probe 33, so called because it serves to increase or bring up the value of the resistor being trimmed.

When, as shown in FIG. 5, the tip of "Down" probe 31 is brought into the vicinity of printed resistor 34 mounted on the substrate 35 of a chip, the corona discharge beam CB acts to irradiate the resistor at the point of impingement. The resistive material so irradiated is subjected to an ionic action affecting its resistive characteristics.

Resistor 34 is connected in the circuit of an ohmmeter 36 so that its value may be read as trimming is carried out. It has been found, for reasons which are not understood theoretically, that when a point or zone on the surface of a printed circuit resistor is subjected to the corona discharge, the resistive properties thereof are so affected as to cause a decrease in resistance without any perceptible physical change. The extent of this change at the point of irradiation depends on the duration of corona exposure, although as the discharge continues, the ohmic change tends to level off. However, since one ordinarily seeks to make only a slight change to bring a printed resistor from its initial value to within a predetermined tolerance, it is normally necessary to expose the resistor to only a brief period of corona discharge.

In practice, particularly when used in mass production, the system may be automated by an arrangement acting to switch off the corona discharge at the instant the resistor attains its precise value.

Should it be necessary to increase the value of the printed resistor, then Up probe 23, as shown in FIG. 6, is brought into direct contact with a point on resistor 34. Since the single-turn coil coupled to this probe yields a relatively low voltage having a high current density, no corona is produced, but the resultant heating current which passes through the resistor brings about an upward change in resistance value. By observing this change on the ohmmeter, one may maintain probe contact or current flow until the desired resistor value is attained.

The effect of the "Down" and "Up" probe operations is reversible within certain limits, so that if one inadvertently overshoots the resistance value with one probe, it is possible to correct it with the other. Thus the invention virtually does away with rejections as a result of trimming and makes possible the economical and rapid production of printed resistors having precise values.

Because probe assembly PA is light weight and portable, and is linked to generator unit GU by an extension cable, its position relative to a chip to be treated may be governed by a servo mechanism or other controllable positioning means so as to place the probes in operation relative to a chip being treated.

While there has been shown and described a preferred embodiment of a system for trimming microelectronic resistors in accordance with the invention, it will be appreciated that many changes and modifications may be made therein without, however, departing from the essential spirit thereof.

I claim:

1. A system for electronically trimming the ohmic value of a printed circuit resistor without changing its physical dimensions, said system comprising:

A a self-contained generating unit producing a low radio-frequency carrier having a predetermined frequency which is overmodulated by a sonic frequency to cause the carrier to be periodically interrupted to produce periodic bursts of radio-frequency energy at a repetition rate determined by the sonic frequency, whereby bursts of such energy are yielded at an output terminal;

B a portable probe assembly independent of the generating unit including a tank circuit tuned to the carrier frequency, a tipped "Up" probe directly coupled by step-up means to the tank circuit and a tipped "Down" probe directly coupled by step-down means to the tank circuit; and C an extension cable connecting the output terminal of the generating unit to the tank circuit of the probe assembly whereby a corona discharge beam is projected from the tip of the "Down" probe, which beam when directed at the resistor acts to decrease its ohmic value, and a relatively low voltage having a high current density is established at the tip of the "Up" probe when it makes contact with the resistor to effect an increase in its ohmic value.

2. A system as set forth in claim 1, wherein said carrier frequency lies in an operating range of about 200,000 to 300,000 Hz.

3. A system as set forth in claim 1, wherein said sonic frequency lies in the range of 2000 to 3000 Hz.

4. A system as set forth in claim 1, wherein said probe assembly is housed in a tube, and said cable is a coaxial cable whose outer conductor is grounded.

5. A system as set forth in claim 1, wherein said unit includes a crystal-controlled oscillator operating at said carrier frequency.

6. A system as set forth in claim 5, wherein the tank circuit is formed by a tank coil in parallel with a capacitor tuned to the carrier frequency.

7. A system as set forth in claim 6, wherein said step-up means is in a multi-turn coil of high inductance coupled to the tank coil.

* * * * *